United States Patent
Tschanz et al.

(10) Patent No.: US 7,397,395 B2
(45) Date of Patent: Jul. 8, 2008

(54) REPRESENTATIVE MAJORITY VOTER FOR BUS INVERT CODING

(75) Inventors: James W Tschanz, Portland, OR (US); Mircea R. Stan, Charlottesville, VA (US); Muhammad M Khellah, Tigard, OR (US); Yibin Ye, Portland, OR (US); Vivek K De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 559 days.

(21) Appl. No.: 11/059,174

(22) Filed: Feb. 16, 2005

(65) Prior Publication Data

US 2006/0184595 A1    Aug. 17, 2006

(51) Int. Cl.
 *H03M 7/00* (2006.01)
(52) U.S. Cl. .......................... 341/51; 341/50
(58) Field of Classification Search ............. 341/50–70; 326/11, 35; 714/760, 797
See application file for complete search history.

(56) References Cited

U.S. PATENT DOCUMENTS

| | | | | |
|---|---|---|---|---|
| 5,923,830 | A | * | 7/1999 | Fuchs et al. .................. 714/11 |
| 7,173,947 | B1 | * | 2/2007 | Ramakrishnan et al. ..... 370/537 |
| 2006/0033523 | A1 | * | 2/2006 | Erstad et al. .................. 326/9 |

OTHER PUBLICATIONS

Stan, Mircea R., et al., "Bus-Invert Coding for Low-Power I/O", *IEEE Transactions on Very Large Scale Integration (VLSI) Systems*, vol. 3, No. 1, Mar. 1995, 49-58.
Tschanz, James W., et al., "Majority Voter Apparatus, Systems and Methods", U.S. Appl. No. 10/947,765, filed Sep. 23, 2004.

* cited by examiner

*Primary Examiner*—Lam T Mai
(74) *Attorney, Agent, or Firm*—Douglas J. Ryder; Ryder IP Law, PC

(57) ABSTRACT

In general, in one aspect, the disclosure describes an apparatus inluding a representative majority voter gate to analyze bit transitions of a plurality of bits. The plurailuty of bits are analzed in groups. The representative majority voter gate generates an invert signal based on the analysis. The apparatus further inludes a conditional inverter to apply the invert signal to the pluraility of bits.

21 Claims, 9 Drawing Sheets

| | $t_0$ | $t_1$ | Trans |
|---|---|---|---|
| $b_0$ | 0 | 0 | N |
| $b_1$ | 0 | 0 | N |
| $b_2$ | 0 | 0 | N |
| $b_3$ | 0 | 0 | N |
| $b_4$ | 0 | 1 | Y |
| $b_5$ | 0 | 1 | Y |
| $b_6$ | 0 | 1 | Y |
| $b_7$ | 0 | 1 | Y – 3 data transitions |
| Inv | 0 | 0 | N – no data transitions |

| | $t_2$ (I) | $t_3$ | Trans |
|---|---|---|---|
| $b_0$ | 0 | 0 | N |
| $b_1$ | 0 | 0 | N |
| $b_2$ | 0 | 0 | N |
| $b_3$ | 0 | 0 | N |
| $b_4$ | 0 | 0 | N |
| $b_5$ | 0 | 0 | N |
| $b_6$ | 0 | 0 | N |
| $b_7$ | 0 | 0 | N – no data transitions |
| Inv | 1 | 0 | Y – 1 invert bit transition |
| | | | 1 total transition |

| | $t_1$ | $t_2$ | Trans |
|---|---|---|---|
| $b_0$ | 0 | 1 | Y |
| $b_1$ | 0 | 1 | Y |
| $b_2$ | 0 | 1 | Y |
| $b_3$ | 0 | 1 | Y |
| $b_4$ | 1 | 1 | N |
| $b_5$ | 1 | 1 | N |
| $b_6$ | 1 | 1 | N |
| $b_7$ | 1 | 1 | N – 5 |
| Inv | 0 | 1 | — |

| | $t_2$ (I) | | Trans |
|---|---|---|---|
| $b_0$ | 0 | | N |
| $b_1$ | 0 | | N |
| $b_2$ | 0 | | N |
| $b_3$ | 0 | | N |
| $b_4$ | 0 | | N |
| $b_5$ | 0 | | Y |
| $b_6$ | 0 | | Y |
| $b_7$ | 0 | | Y – 3 data transitions |
| Inv | 1 | | Y – 1 invert bit transition |
| | | | 4 total transitions |

| | $t_3$ | $t_4$ | Trans |
|---|---|---|---|
| $b_0$ | 0 | 1 | Y |
| $b_1$ | 0 | 1 | Y |
| $b_2$ | 0 | 1 | Y |
| $b_3$ | 0 | 1 | Y |
| $b_4$ | 0 | 0 | N |
| $b_5$ | 0 | 0 | N |
| $b_6$ | 0 | 0 | N |
| $b_7$ | 0 | 0 | N – 4 data transitions |
| Inv | 0 | 0 | N – no invert bit transition |
| | | | 4 total transitions |

REPRESENTATIVE MAJORITY VOTER FOR BUS INVERT CODING

BACKGROUND

Buses are used to transmit data from a device to one or more other devices. Interconnects (e.g., on chip interconnects) are used to transmit data form one function on a chip (e.g., microprocessor) to one or more other functions on the chip. Switching data on a bus or interconnects is a significant source of power consumption.

In high-performance microprocessor designs power consumption is a critical concern, and bus/interconnect power is a large component. Microprocessors that include several processor cores on a single die may require long (traverse a long distance across the die) and wide (large number of parallel bits) buses as interconnections. Each time a bus line is switched, the entire capacitance of the metal wire must be charged or discharged, as well as the capacitance of the repeaters which are inserted along the bus to reduce the delay. Both of these capacitances can be quite large, thus the switching,power is significant.

BRIEF DESCRIPTION OF THE DRAWINGS

The features and advantages of the various embodiments will become apparent from the following detailed description in which:

FIG. 1 illustrates an exemplary eight bit bus transitioning over several clock cycles, according to one embodiment;

FIG. 2 illustrates an exemplary nine bit (eight bits data, one invert bit) bus transitioning over several clock cycles, according to one embodiment;

DETAILED DESCRIPTION

Figure 1:
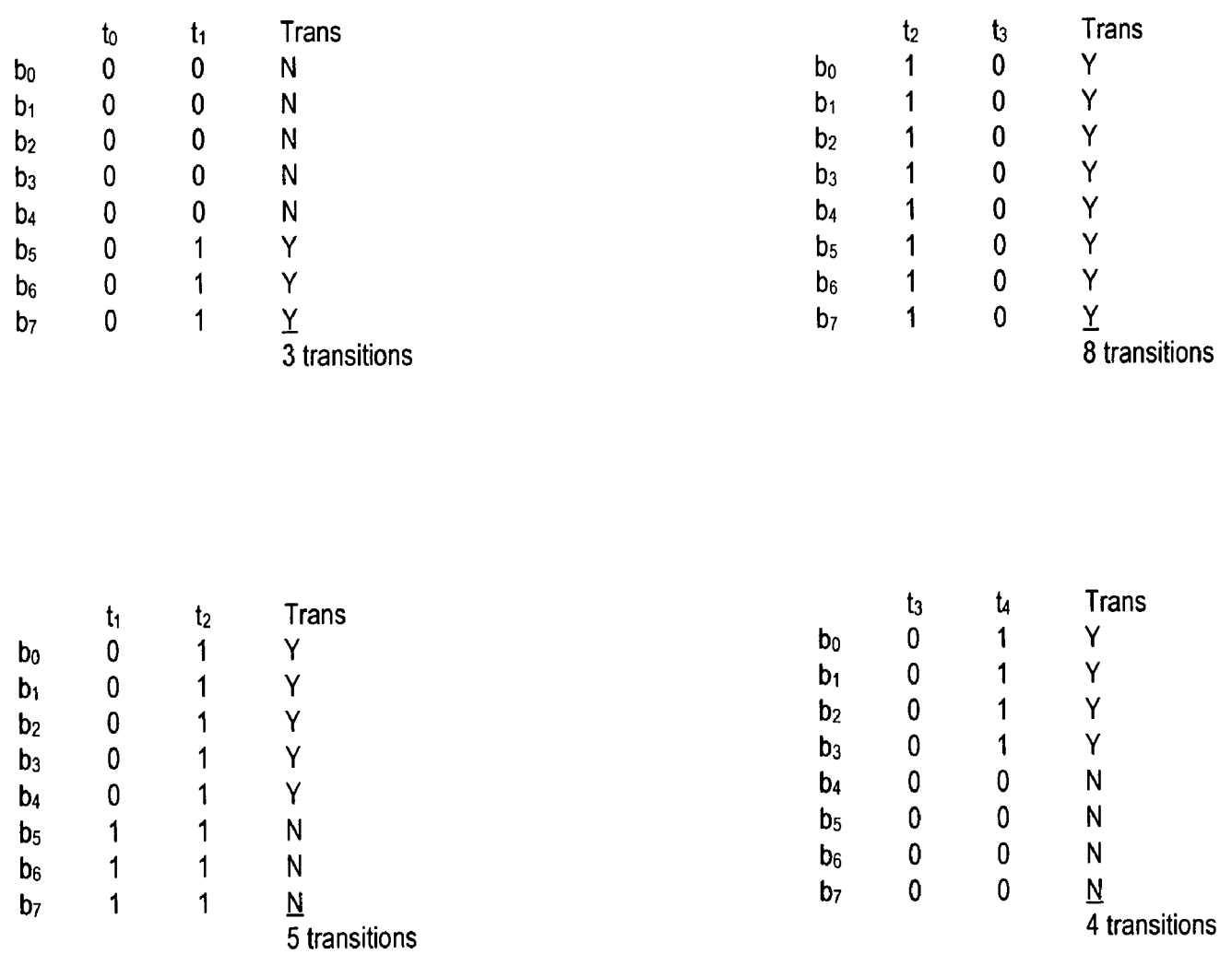
Figure 3:
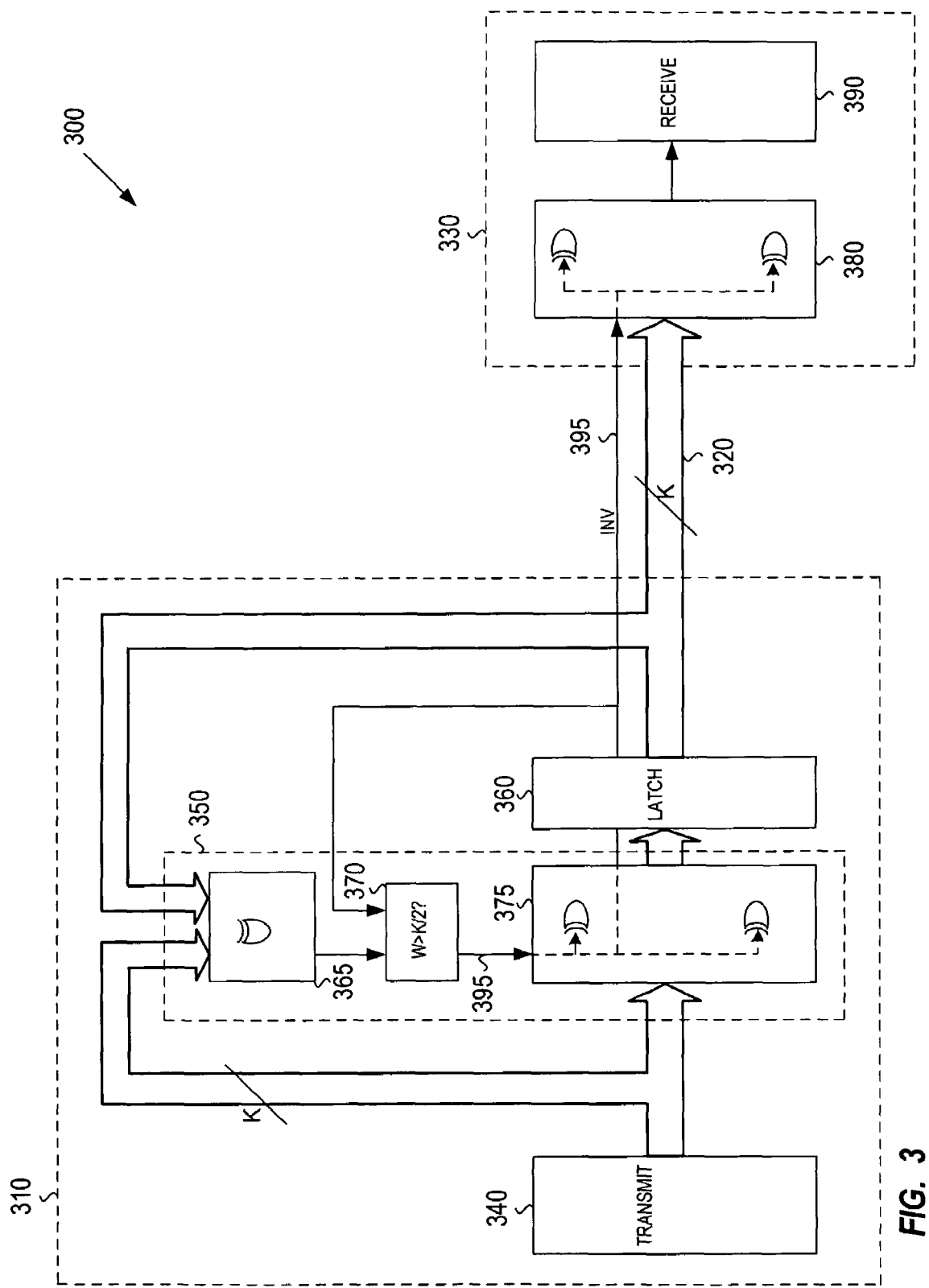
FIG. 3 illustrates an exemplary bus-invert coding system, according to one embodiment.

FIG. 1 illustrates an exemplary eight bit bus transitioning over several clock cycles. During a first clock cycle ($t_0$) the bus transmits all 0s. During a second clock cycle ($t_1$) the bus transmits 5 0s (bits $b_0$-$b_4$) and3 1s ($b_5$-$b_7$). Comparing the bits transmitted during $t_0$ and $t_1$ indicates that 3 bits (bits $b_5$-$b_7$) are being transitioned. Accordingly, the 3 bus lines associated with $b_5$-$b_7$ would be switched. During a third clock cycle ($t_2$) the bus transmits all 1s. Comparing the bits transmitted during $t_1$ and $t_2$ indicates that 5 bits (bits $b_0$-$b_4$) are being transitioned. Accordingly, the 5 bus lines associated with $b_0$-$b_4$ would be switched. During a fourth clock cycle ($t_3$) the bus transmits all 0s. Comparing the bits transmitted during $t_2$ and $t_3$ indicates that all bits (bits $b_0$-$b_7$) are being transitioned. Accordingly, all 8 bus lines would be switched. During a fifth clock cycle ($t_4$) the bus transmits 4 0s (bits $b_4$-$b_7$) and 4 1s ($b_0$-$b_3$). Comparing the bits transmitted during $t_3$ and $t_4$ indicates that 4 bits (bits $b_0$-$b_3$) are being transitioned. Accordingly, the 4 bus lines associated with $b_0$-$b_3$ would be switched.

One way to reduce the switching power of a bus is to reduce the number of transitions that occur on the bus lines. One technique to reduce the transitions is bus-invert coding. In bus-invert coding, the number of transitions on the bus is reduced by sending either the true or the complement of the bus inputs on each clock cycle. If less than half of the inputs undergo a transition, the true values are sent. If more than half of the inputs undergo a transition, all are inverted and the complement values are sent, which results in less than half of the bus lines transitioning. An extra bit line is required for the bus to indicate whether real or inverted bits are being sent. A receiver at the end of the bus may invert the received data to recover the original inputs if the data transmitted was inverted. Thus, using this technique, the maximum number of simultaneous transitions on the bus is equal to half of the bus lines plus possibly the additional line which signals whether the true or complement of the inputs is being sent.

FIG. 2 illustrates an exemplary nine bit (eight bits data, one invert bit) bus transitioning over several clock cycles. It should be noted that the data prepared for transmission during each clock cycle is the same data that was prepared for transmission in FIG. 1, while the data actually transmitted is inverted for certain cycles. During a first clock cycle ($t_0$) the bus transmits all 0s. During a second clock cycle ($t_1$) the bus has 5 0s (bits $b_0$-$b_4$) and 3 1s ($b_5$-$b_7$) prepared for transmission. Comparing the bits transmitted during $t_0$ and those prepared for transmission during $t_1$ indicates that 3 bits (bits $b_5$-$b_7$) are being transitioned. As less then half of the bits are being transitioned the invert bit (bit $b_8$) will not be set and the real data is transmitted. Accordingly, the 3 bus lines associated with $b_5$-$b_7$ would be switched. During a third clock cycle ($t_2$) the bus has all 1s prepared for transmission. Comparing the bits transmitted during $t_1$ and those prepared for transmission during $t_2$ indicates that 5 bits (bits $b_0$-$b_4$) are being transitioned. As more then half of the bits are being transitioned the invert bit (bit $b_8$) is set and the data received is inverted (to all 0s). Inverting the data results in a total of 4 bus lines (3 data lines associated with $b_5$-$b_7$ and the invert bit) being transitioned. The inverted data is transmitted during $t_2$. Accordingly, the 4 associated bus lines would be switched.

During a fourth clock cycle ($t_3$) the bus has all 0s prepared for transmission. Comparing the bits transmitted during $t_2$ (the inverted data) and the bites prepared for transmission $t_3$ indicates that no bits are being transitioned. As less then half of the bits are being transitioned the invert bit (bit $b_8$) will not be set and the real data is transmitted. Accordingly, the only bus line being switched would be the invert bit. During a fifth clock cycle ($t_4$) the bus has 4 0s (bits $b_4$-$b_7$) and 4 1s ($b_0$-$b_3$) prepared for transmission. Comparing the bits transmitted during $t_3$ and the bits prepared for transmission during $t_4$ indicates that 4 bits (bits $b_0$-$b_3$) are being transitioned. As exactly half of the bits are being transitioned, the invert bit (bit $b_8$) is not set and the real data is transmitted. Accordingly, the 4 bus lines associated with $b_0$-$b_3$ would be switched.

According to an alternative embodiment, the invert bit may be set and the data inverted if exactly half of the bits are being switched. According to an alternative embodiment, the setting of the invert bit when exactly half of the data bits are being transitioned may depend on the previous setting of the invert bit. That is, the invert bit may mirror what the previous invert bit was so as not to cause a transition on that line. In this case if the invert bit was previously set it would stay set and if it was not set it would stay unset.

Comparing the bus transitions of FIG. 1 (normal) to FIG. 2 (bus invert coding), shows that the bus invert coding has the same or less transitions. Between $t_0$ and $t_1$ both normal and bus invert coding had 3 transitions. Between $t_1$ and $t_2$ the normal transmission had 5 transitions while bus invert coding had 4 transitions (3 data bits and the invert bit). Between $t_2$ and $t_3$ the normal transmission had 8 transitions while bus invert coding had 1 transition (the invert bit). Between $t_3$ and $t_4$ both normal and bus invert coding had 4 transitions.

FIG. 3 illustrates an exemplary bus-invert coding system 300. The system 300 includes a transmission unit 310, a bus 320 and a receiving unit 330. The transmission unit 310 includes a transmitter 340, an encoder 350 and a latch 360. The encoder 350 includes an XOR 365, an adder 370 and a conditional inverter (plurality of XORs) 375. The bus 320 includes a line for each bit being transmitted (e.g., k bits) plus an additional line for a signal identifying whether inverted or real values are being transmitted. The receiving unit 330 includes a conditional inverter (plurality of XORs) 380 and a receiver 390.

The system 300 may be implemented on a chip (e.g., microprocessor) where the transmission unit 310 and the receiving unit 330 are functions on the chip and the bus 320 is a point-to-point interconnect between the functions. The system 300 may be implemented between chips or devices where the transmission unit 310 is one chip or device and the receiving unit 330 is another chip or device and the bus 320 connects the chips or devices. The transmission unit 310 may transmit the data to more than one receiving unit 330 and the bus 320 may be a point-to-multipoint bus.

The encoder 350 uses the XOR 355 to compare the data previously sent to the data ready to be transmitted in order to determine if a transition has occurred. The adder 360 examines each bit to determine whether there is a transition and adds all of the transitions to decide whether more or less that half of the bits were transitioned. The adder 360 sends an inverting signal 395 based on number of bits transitioning. If more than half are transitioned the adder 360 sends a '1' to the conditional inverter 375. If less then half are transitioned then the adder sends a '0' to the conditional inverter 375. The conditional inverter 375 inverts the signals if a '1' is received and passes the real signals if a '0' is received. The latch 360 transmits the real or inverted signals along with the inverting signal 395 (0 or 1 depending on whether or not to invert) at the appropriate time. The conditional inverter 380 receives the transitions and the inverting signal 395 and either re-inverts the signals or passes the signals through based on the inverting signal 395.

There are three main sources of overhead in the bus-invert coding scheme: the encoder 350, the one additional bus line, and the conditional inverter 380. The conditional inverter 380 is simply an XOR gate and thus does not represent a significant overhead for long buses. The extra bus line becomes less important for very wide buses. The encoder 350 presents a significant circuit design problem as the adder 370 examines every input to determine whether there is a transition, and then add up all of the transitions to decide what polarity to send down the bus. The encoder 350 utilizing the adder 370 can be referred to as an "exact" majority voter gate. The complexity of the adder 370 grows exponentially with the number of bits on the bus and represents a large delay and power penalty. The adder 370 severely limits the applications where bus-invert coding can be used.

According to one embodiment, rather than examining all of the inputs to find the exact number that have a transition (as the adder/exact majority voter gate 370 of FIG. 3 does), a group of inputs is examined at a time and results are combine in a tree to arrive at a final decision. This scheme requires less logic levels than an exact majority voter gate, reducing the delay and energy overhead for the bus-invert encoder. Examining a group of transitions at a time is known as a "representative" majority voter gate. Several different implementations of the "representative" majority voter gate are possible, depending on how many bits are combined in each level of the tree.

Figure 4:
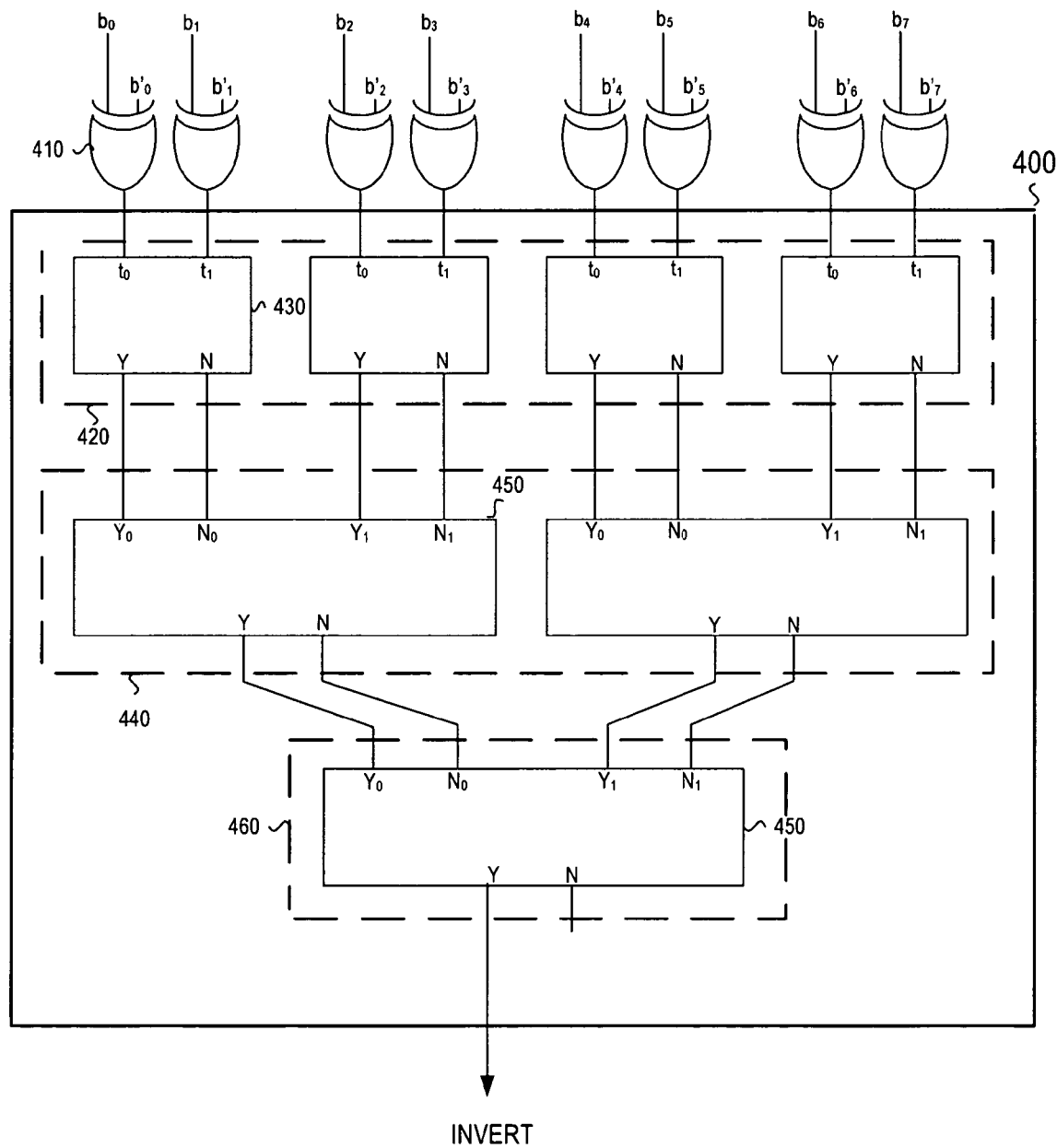
FIG. 4 illustrates an exemplary representative majority voter gate using 2:1 voting gates for a 8-bit bus, according to one embodiment.

FIG. 4 illustrates an exemplary representative majority voter gate 400 using 2:1 voting gates for an 8-bit bus. The representative majority voter gate 400 taking the place of the adder/exact majority voter gate 370 of FIG. 3. The incoming bits ($b_0$-$b_7$) are first compared to the previous data on the bus ($b'_0$-$b'_7$) using XOR gates 410 (e.g., XOR 365 of FIG. 3) which outputs a '1' if a transition occurred and a '0' if the data is the same. A first level 420 of the representative majority voter gate 400 uses 2:1 gates 430 to process two transition bits at a time (e.g., bits 0 and 1). Each gate 430 generates a yes (Y) and a No (N) output. Only one bit can be active (set to '1') at a time. If both bits have a transition, the Y output will be set to one and the N output will be set to zero. If neither bit has a transition, the N bit will be set to one and the Y output will be set to zero. If one bit transitions and the other doesn't, both the Y and the N bits will be set to 0 indicating a "don't care" condition at this stage.

A second level 440 of the representative majority voter gate 400 uses 2:1 gates 450 to receive and process Y and N outputs from two gates 430 and generate a Y and N output based thereupon. As noted above, the outputs from the gates 430 will only have a Y or an N active so that the input to the gate 450 will only have 1 active input for each set of inputs it is processing. The output Y of a gate 450 is set if both inputs are Y (Y=1, N=0), or if one input is Y and the other is "don't care" (Y=0, N=0). The output N is set if both inputs are N (Y=0, N=1), or if one input is N and the other is "don't care". Neither bit is set (Y=0, N=0) if both inputs have a "don't care" condition or if one input is Y and one input is N. The 2:1 gates 450 are continually used at the various levels of the tree until all bits have been combined. The exemplary representative majority voter gate 400 includes a third level 460 containing a single gate 450. An "invert" signal is then given by the "Y" output of the final gate. If the "invert" signal is a one, all data bits are inverted before being sent down the bus.

Figure 5:
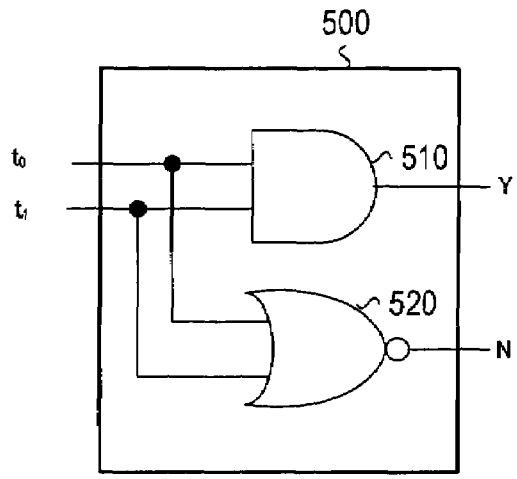
FIG. 5 illustrates an exemplary logic diagram (implementation) of a 2:1 gate, according to one embodiment.

FIG. 5 illustrates an exemplary logic diagram (implementation) of a 2:1 gate 500 (e.g., gate 430 of FIG. 4). The gate 500 includes an AND gate 510 and an NOR gate 520. The AND gate 510 receives the transition value for each of the two bits and generates a Y output. The Y output is active (set to 1) only if both inputs are 1. The NOR gate 520 receives the transition value for each of the two bits and generates an N output. The N output is active (set to 1) only if both inputs are 0.

Figure 6:
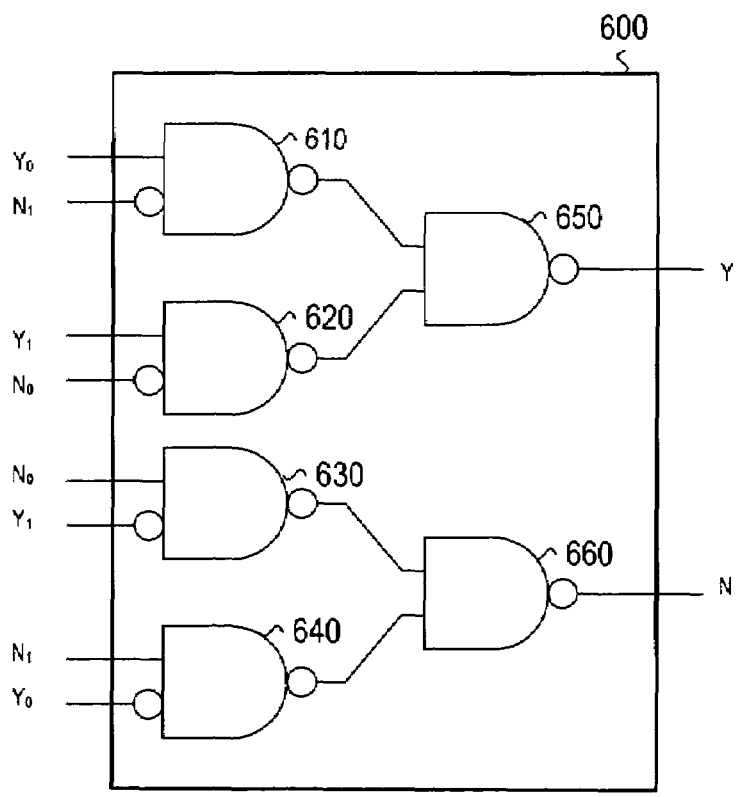
FIG. 6 illustrates an exemplary logic diagram (implementation) of a 2:1 gate, according to one embodiment.

FIG. 6 illustrates an exemplary logic diagram (implementation) of a 2:1 gate 600 (e.g., gate 450 of FIG. 4). The gate 600 includes four NAND gates 610, 620, 630, 640 having one input inverted. Each of the NAND gates 610-640 receives a different combination of inputs. A first NAND gate 610 receives a first Yes input ($Y_0$) and an invert of a second No input ($N_1$). A second NAND gate 620 receives a second Yes input ($Y_1$) and an invert of a first No input ($N_0$). A third NAND gate 630 receives the No and an invert of the $Y_1$. A fourth NAND gate 640 receives the N, and an invert of the $Y_0$. The output of the first and second NAND gates 610, 620 are sent to a fifth NAND gate 650 to generate the Y output. The output of the third and fourth NAND gates 630, 640 are sent to a sixth NAND gate 660 to generate the N output.

Figure 7:
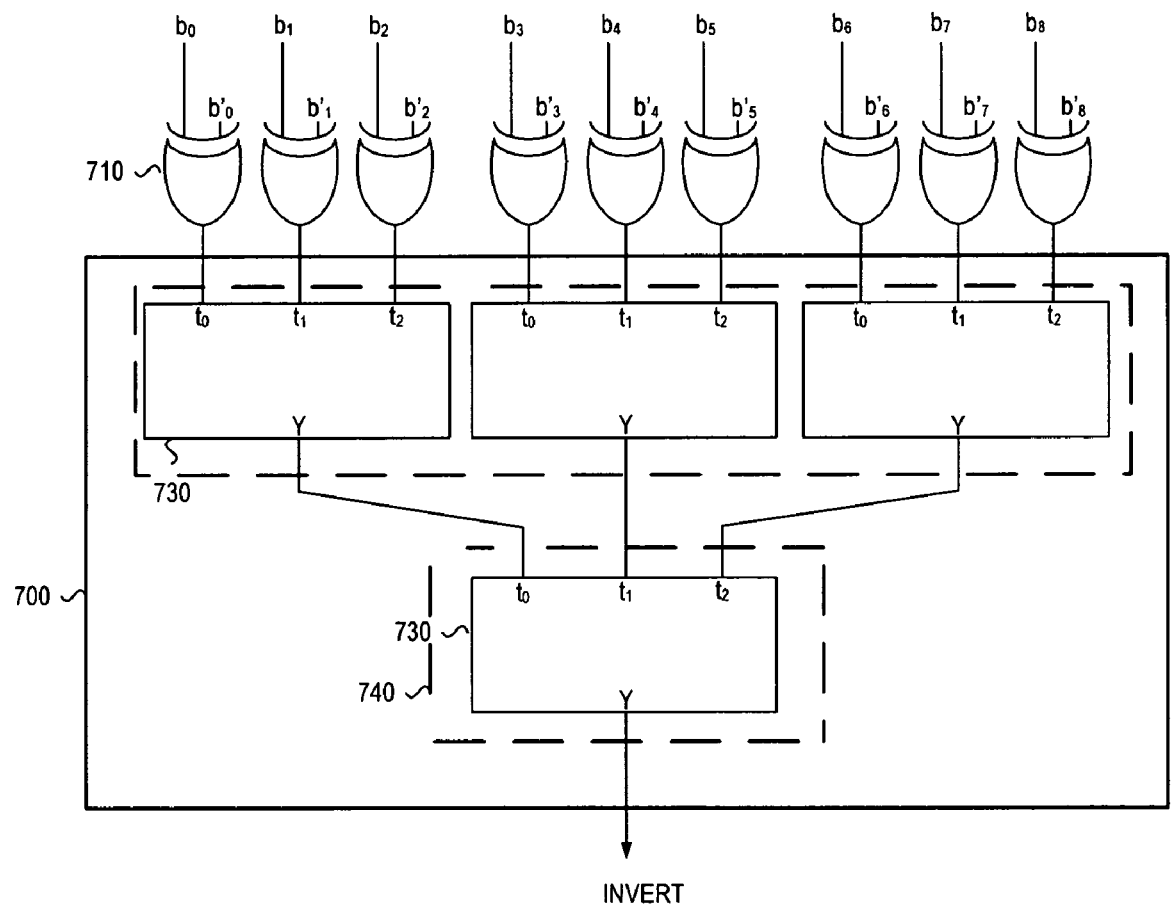
FIG. 7 illustrates an exemplary representative majority voter gate using 3:1 voting gates for a 9-bit bus, according to one embodiment.

FIG. 7 illustrates an exemplary representative majority voter gate 700 using 3:1 voting gates for a 9-bit bus. The representative majority voter gate 700 taking the place of the adder/exact majority voter gate 370 of FIG. 3. The incoming bits ($b_0$-$b_8$) are first compared to the previous data on the bus ($b'_0$-$b'_8$) using XOR gates 710 (e.g., XOR 365 of FIG. 3) which outputs a '1' if a transition occurred and a '0' if the data is the same. A first level 720 of the representative majority voter gate 700 uses gates 730 to process three transition bits at a time (e.g., bits 0-2). Each gate 730 generates a yes (Y) output. If at least two bits out of the three bits has a transition the Y output will be active (set to '1'). If none of the bits has a transition the Y will be inactive (set to '0').

This proceeds down the tree until all bits have been combined. The exemplary representative majority voter gate 700 includes a second level 740 containing a single gate 730. An "invert" signal is then given by the "Y" output of the final gate. If this "invert" signal is a one all data bits are inverted before being sent down the bus.

Figure 8:
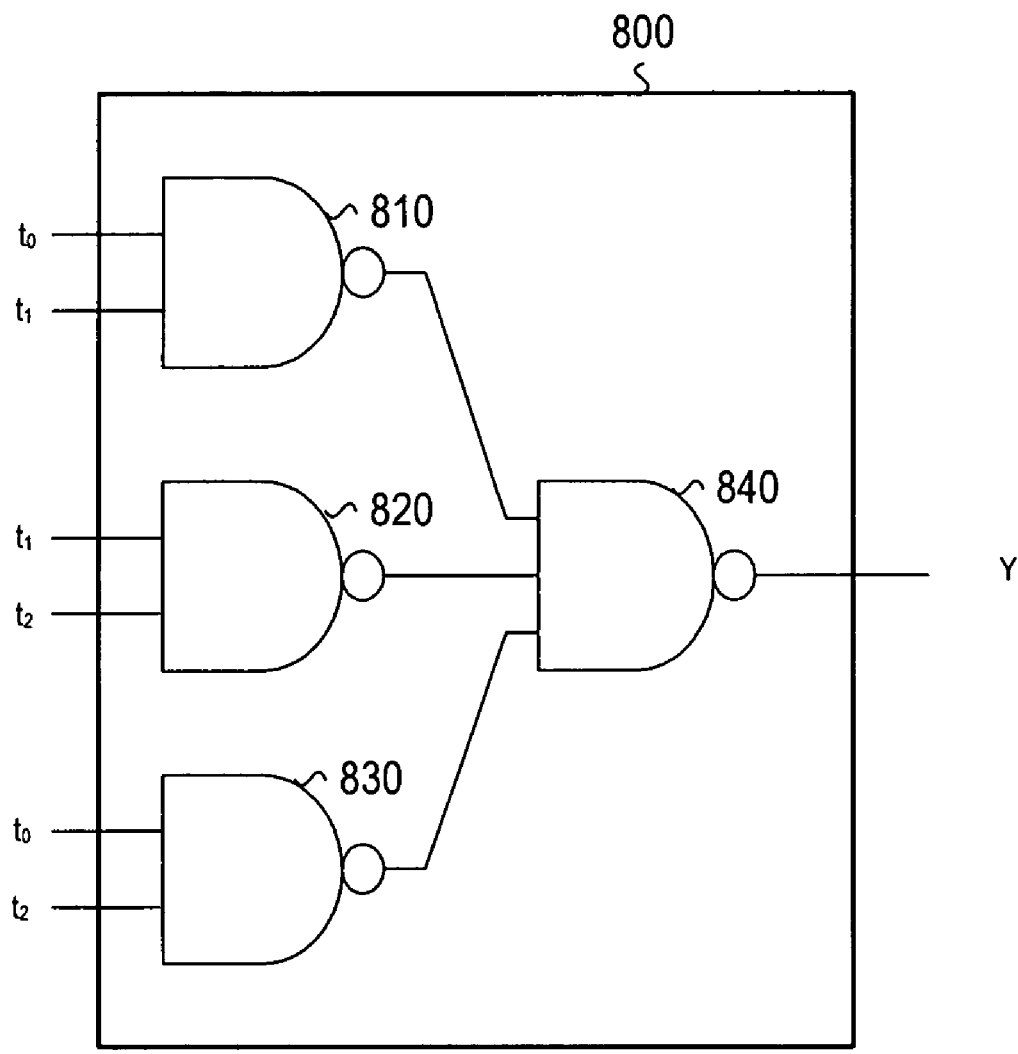
FIG. 8 illustrates an exemplary logic diagram (implementation) of a 3:1 gate, according to one embodiment.

FIG. 8 illustrates an exemplary logic diagram (implementation) of a 3:1 gate 800 (e.g., gate 730 of FIG. 7). The gate 800 includes three NAND gates 810, 820, 830 with each NAND gate receiving a different combination of inputs. A first NAND gate 810 receives a first input ($t_0$) and a second input ($t_1$). A second NAND gate 820 receives the $t_1$ and a third input ($t_3$). A third NAND gate 830 receives the $t_0$ and the $t_2$. The output of each of the NAND gates 810, 820, 830 are sent to a fourth NAND gate 840 to generate the Y output.

Comparing the representative majority voter gate 400 of FIG. 4 to the representative majority voter gate 700 of FIG. 7 shows that the representative majority voter gate 700 has a shorter length tree due to the 3:1 compression versus the 2:1 compression of the representative majority voter gate 400.

The representative majority voter gates (e.g., 400 of FIG. 4, 700 of FIG. 7) approximate the results so there are some cases where the encoder decides not to invert the bus even though the number of transitions on the input is greater than half the number of bits on the bus (num_bits/2). While the exact encoder (e.g., adder 370 of FIG. 3) ensures that the maximum number of lines on the bus that switch at a given time (worst-case switching) is equal to 50% of the bus width (neglecting the extra invert line), using a representative voting encoder results in worst-case switching which is larger.

Figure 9:
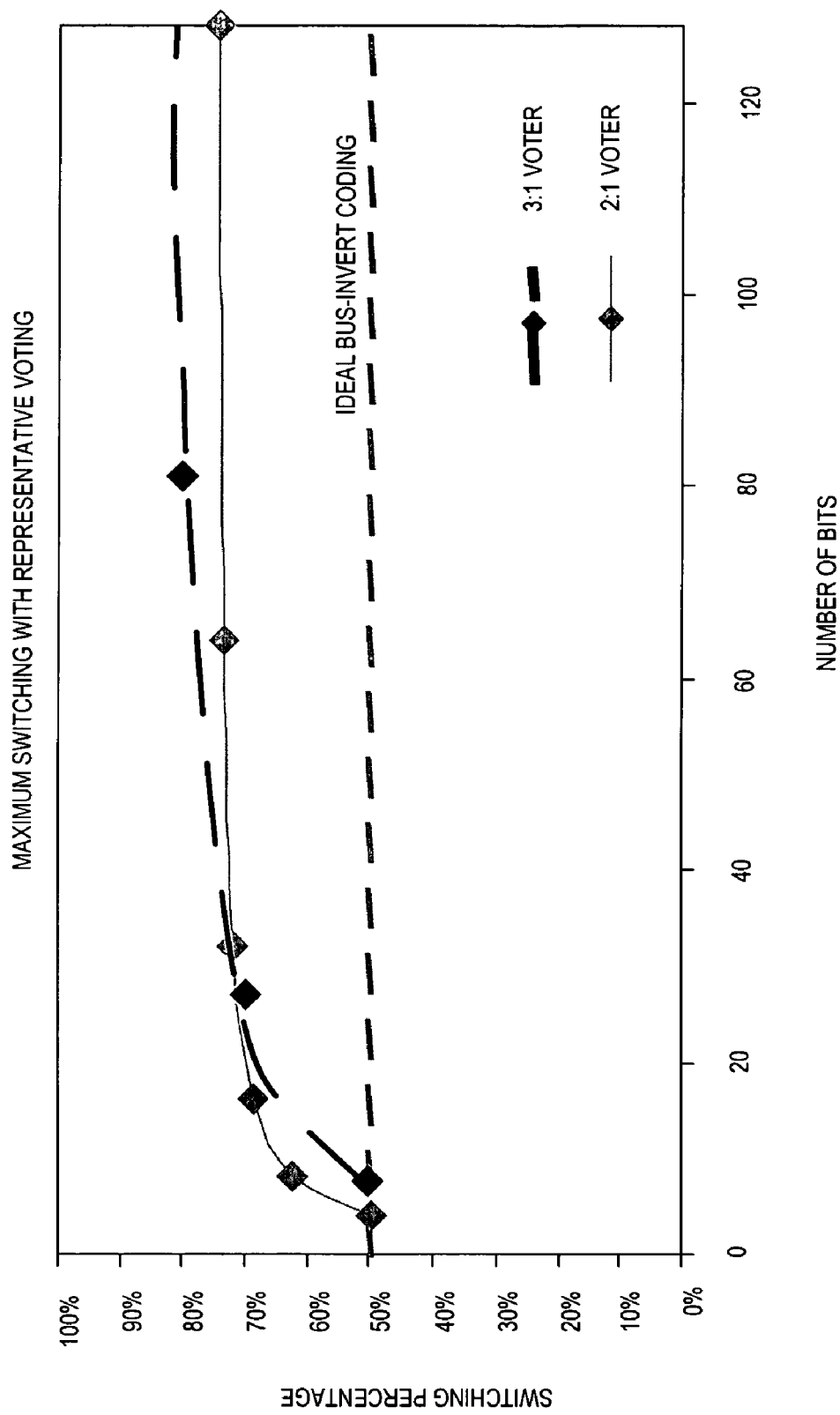
FIG.9 illustrates the worst-case switching percentage for buses of different width using both 2:1 and 3:1 voters, according to one embodiment.

FIG. 9 illustrates the worst-case switching percentage for buses of different width using both 2:1 and 3:1 voters. For a standard bus the worst-case switching percentage is 100%. For an exact bus-invert coded bus (e.g., 370) the worst-case switching is 50%. Encoding the bus using representative voting (e.g., 400, 700) results in worst-case switching percentages from 70%-80% for typical width buses. This still represents a 20-30% power reduction over a standard bus, while incurring significantly less delay and power penalty than a full bus-invert encoder (e.g., 370).

Figure 10:
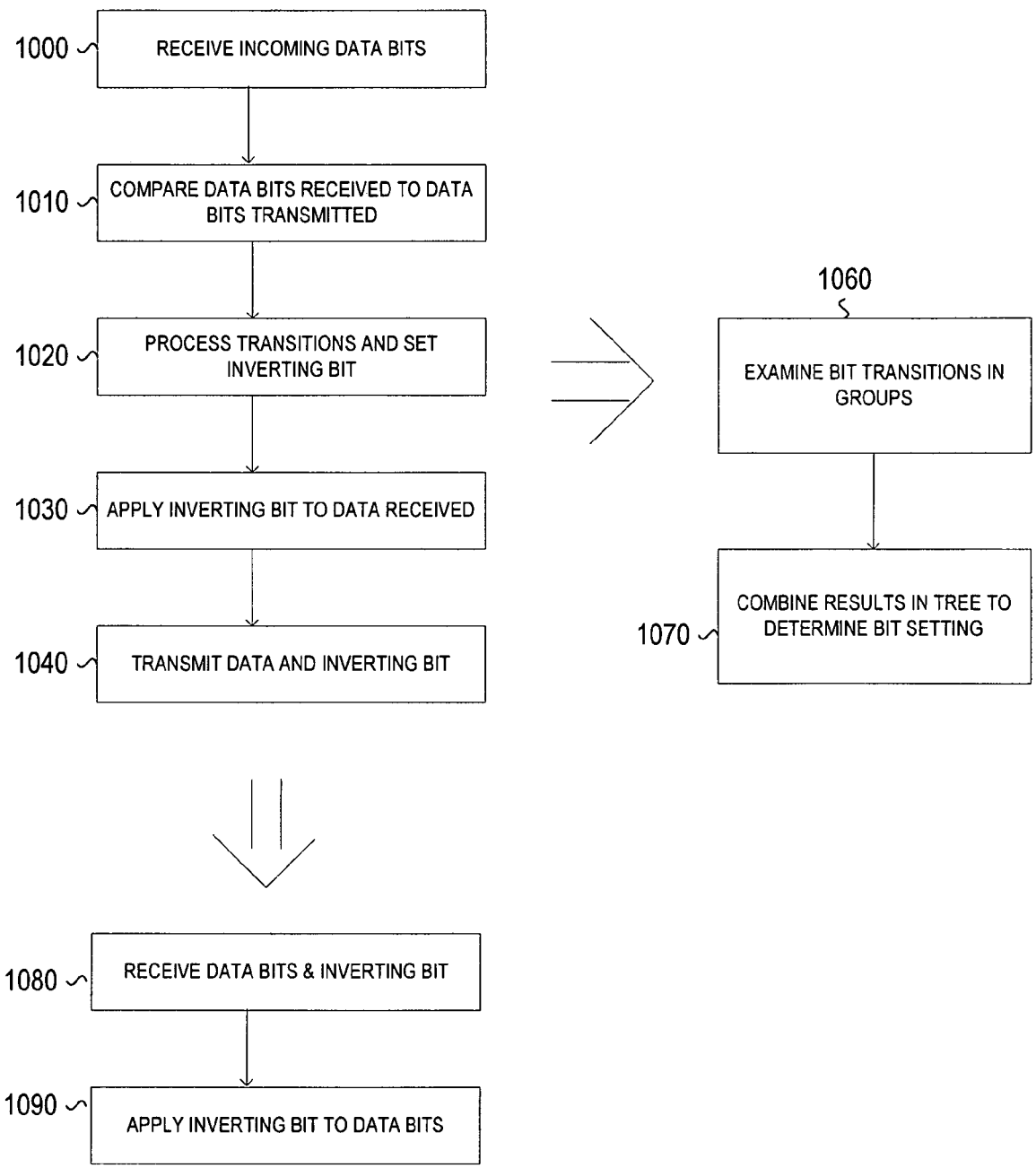
FIG. 10 illustrates an exemplary process flow of bus invert coding, according to one embodiment.

FIG. 10 illustrates an exemplary process flow of bus invert coding. Data bits are prepared for transmission at a transmitter 1000. The data bits being prepared are compared to data bits that were just transmitted to determine which bits were transitioned 1010. The bits transitioned are processed in order to determine how an inverting bit should be set 1020. The inverting bit is applied to the received data 1030. If the inverting bit was set the received data will be inverted and if it was not set the received data will be transmitted as it was received. After application of the inverting bit, the data and the inverting bit are transmitted 1040. The processing transactions 1020 can be further broken down to include examining the bit transactions in groups 1060. Groups of 2 or 3 were discussed above, but the grouping is not limited thereby. After the transitions are examined in groups the results of these groups is continually combined in a tree structure in order to determine the inverter bit setting 1070. The number of levels of the tree depends on the size of the bus and how many bits are combined into a group. The process flow above described the encoding of data as it is prepared for transmission. The transmission of the data entails adding an additional line in the bus to transmit the invert bit. At the receiving end the data and the invert bits are received 1080. If the invert bit it indicates that the data sent was inverted and if the invert bit was not set then the real data was sent. The invert bit is applied to the data 1090 and will either pass the real data or un-invert the inverted data.

The various embodiments described herein could be utilized in a computer system. As one skilled in the art would recognize a computer system includes processor(s) and memory and may interface to periphery, networks, the Internet, and other computer systems. The computer system may include a single die with the processor(s) and memory or may include a processor die and off die memory (e.g., a memory die). The various embodiments may be implemented as part of the memory and/or part of the processor(s).

Although the various embodiments have been illustrated by reference to specific embodiments, it will be apparent that various changes and modifications may be made. Reference to "one embodiment" or "an embodiment" means that a particular feature, structure or characteristic described in connection with the embodiment is included in at least one embodiment. Thus, the appearances of the phrase "in one embodiment" or "in an embodiment" appearing in various places throughout the specification are not necessarily all referring to the same embodiment.

Different implementations may feature different combinations of hardware, firmware, and/or software. It may be possible to implement, for example, some or all components of various embodiments in software and/or firmware as well as hardware, as known in the art. Embodiments may be implemented in numerous types of hardware, software and firmware known in the art, for example, integrated circuits, including ASICs and other types known in the art, printed circuit broads, components, etc.

The various embodiments are intended to be protected broadly within the spirit and scope of the appended claims.

What is claimed:

1. An apparatus comprising
   a representative majority voter gate to analyze bit transitions of a plurality of bits and generate an invert signal based thereon, wherein the plurality of bits are analyzed in groups, wherein said representative majority voter gate includes
      a plurality of transition gates to receive and analyze the bit transitions, wherein each gate receives and analyzes a group of bits and generates a result based on number of bits within the group that are transitioning; and
      at least one result gate to receive and analyze the results, wherein each of the at least one result gate receives and processes a group of results and generates a result based on number of results within the group that indicate a transition, and wherein a final result is the invert signal; and
   a conditional inverter to apply the invert signal to the plurality of bits.

2. The apparatus of claim 1, wherein the plurality of transition gates are 2:1 voter gates to analyze transitions for a group of two bits.

3. The apparatus of claim 2, wherein the transition 2:1 voter gates generate a result that includes at least some subset of a transition bit set if both bits were transitioned, a not transitioned bit set if both bits were not transitioned, and neither a transitioned bit nor a not transitioned bit set if one bit was transitioned and one bit was not transitioned.

4. The apparatus of claim 1, wherein the at least one result gate is a 2:1 voter gate to analyze a group of two results.

5. The apparatus of claim 4, wherein the result 2:1 voter gate generates a result that includes at least some subset of a transition bit set if both results had a transitioned bit set or if one result has the transitioned bit set and other result has neither the transitioned bit nor a not transitioned bit set, a not transition bit set if both results had a not transitioned bit set or if one result has the not transitioned bit set and other result had neither the not transitioned bit nor a transitioned bit set, and neither a transitioned bit nor a not transitioned bit set if both results had neither the not transitioned bit nor the transitioned bit set or if one result had the transitioned bit set and other result had the not transitioned bit set.

6. The apparatus of claim 1, wherein the plurality of transition gates are 3:1 voter gates to analyze transitions for a group of three bits.

7. The apparatus of claim 6, wherein the transition 3:1 voter gates set a transition bit if at least two bits were transitioned.

8. The apparatus of claim 1, wherein the at least one result gate is a 3:1 voter gate to analyze a group of three results.

9. The apparatus of claim 8, wherein the result 3:1 voter gate sets a transition bit if at least two results had a transitioned bit set.

10. An apparatus comprising
a representative majority voter gate to analyze bit transitions of a plurality of bits and generate an invert signal based thereon, wherein the plurality of bits are analyzed in groups, wherein said representative majority voter gate analyzes transitions in groups, and wherein results are analyzed in groups in a tree structure until a single result is obtained, wherein the single result is the invert signal; and
a conditional inverter to apply the invert signal to the plurality of bits.

11. An apparatus comprising
a representative majority voter gate to analyze bit transitions of a plurality of bits and generate an invert signal based thereon, wherein the plurality of bits are analyzed in groups;
a conditional inverter to apply the invert signal to the plurality of bits;
a comparator to compare data bits to determine bits that have transitioned, wherein the comparison is between data bits previously sent and data bits preparing to be sent; and
a bus to transmit the data bits from the conditional inverter and the invert signal.

12. The apparatus of claim 11, further comprising a second conditional inverter to receive the data bits and the invert signal and apply the invert signal to the data bits.

13. The apparatus of claim 12, wherein the comparator, the representative majority voter gate, and the conditional inverter are part of a transmission unit and the second conditional inverter is part of a receiving unit.

14. The apparatus of claim 13, wherein the receiving unit is a first function on a chip, the transmission unit is a second function on the chip, and the bus is an interconnect between the two functions on the chip.

15. The apparatus of claim 14, wherein the chip is a microprocessor.

16. A method comprising
analyzing bit transitions of a plurality of bits, wherein the plurality of bits are analyzed in groups, wherein said analyzing includes analyzing the transitions in groups, and analyzing results in groups in a tree structure until a single result is obtained;
generating an invert signal based on said analyzing, wherein said generating includes using the single result as the invert signal; and
applying the invert bit and the plurality of bits to a conditional inverter.

17. A method comprising
analyzing bit transitions of a plurality of bits, wherein the plurality of bits are analyzed in groups;
generating an invert signal based on said analyzing;
applying the invert bit and the plurality of bits to a conditional inverter;
comparing data bits previously sent and data bits preparing to be sent to determine bits that have transitioned; and
transmitting data bits output from the conditional inverter and the invert signal.

18. The method of claim 17, further comprising
receiving the data bits output from the conditional inverter and the invert signal; and
applying the invert signal and the data bits to a second conditional inverter.

19. A computer comprising:
an off die memory device; and
a processor die including a first function, a second function and an interconnect therebetween, wherein the first function includes
a comparator to compare data bits to determine bits that have transitioned, wherein the comparison is between a first set of data bits previously sent and a second set of data bits preparing to be sent;
a representative majority voter gate to analyze the transitions in order to determine if an invert bit should be set, wherein the representative majority voter gate analyzes the bits in groups; and
a first conditional inverter to apply the invert bit to the second set of data bits to generate a third set of data bits;
wherein the interconnect includes enough data lines to transmit the third set of data bits and an additional line to transmit the invert signal; and
wherein the second function includes a second conditional inverter to receive the third set of data bits and the invert signal and apply the invert signal to the third set of data bits to generate a fourth set of data bits.

20. The computer of claim 19, wherein the representative majority voter gate includes
a plurality of transition gates to receive and analyze bit transitions, wherein each gate receives and analyzes a group of bits at a time and generates a result based on number of bits within the group that are transitioning; and
at least one result gate to receive and analyze the results, wherein each of the at least one result gate receives and processes a group of results and generates a result based on number of results within the group that indicate a transition, and wherein a final result is the invert signal.

21. The computer of claim 19, wherein the representative majority voter gate analyzes transitions in groups, and wherein results are analyzed in groups in a tree structure until a single result is obtained, wherein the single result is the invert signal.

* * * * *